MONOLITHIC SEMICONDUCTOR MICROCIRCUITS WITH IMPROVED MEANS FOR CONNECTING POINTS OF COMMON POTENTIAL

Filed July 1, 1966

INVENTOR.
GENE COHEN
BY
W. S. Hill
Agent 3,423,650

MONOLITHIC SEMICONDUCTOR MICROCIRCUITS WITH IMPROVED MEANS FOR CONNECTING POINTS OF COMMON POTENTIAL

Gene Cohen, Morristown, N.J., assignor to Radio Corporation of America, a corporation of Delaware Filed July 1, 1966, Ser. No. 562,169
U.S. Cl. 317—234 4 Claims
Int. Cl. H01l 3/00, 5/00

ABSTRACT OF THE DISCLOSURE

A monolithic semiconductor integrated circuit comprising a plurality of interconnected circuit components including a plurality of separated circuit points that are intended to be operated at a common potential, in a semiconductor body having a lower stratum of relatively high conductivity which serves as a ground plane, diffused regions of high conductivity extending through the body to the lower stratum, and means connecting the common potential points to the high conductivity diffused regions.

Figure 2:
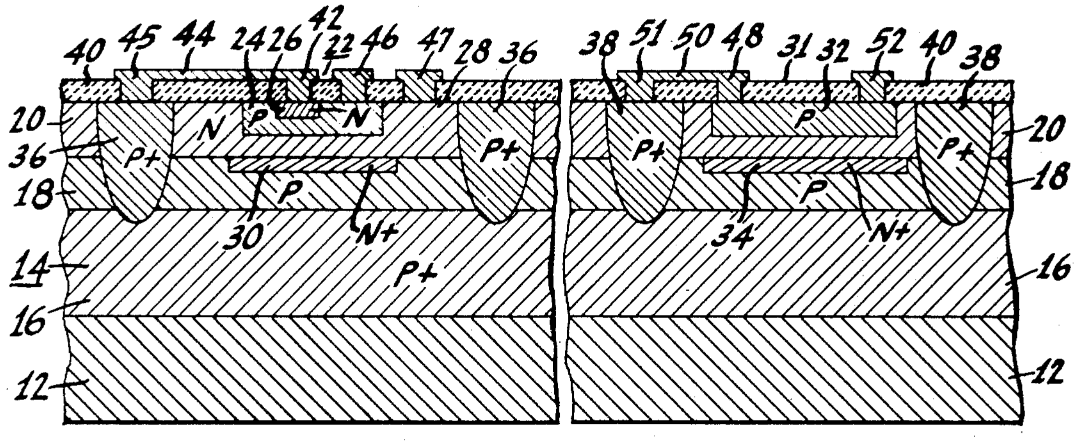

The present invention relates to improved microcircuits of the monolthic semiconductor type. More particularly, the invention relates to circuits of this type with improved means for connecting to a common termination those points which are intended to be operated at ground or other common potential.

One conventional type monolithic semiconductor microcircuit comprises a semiconductor body which is composed of a P type substrate layer of relatively low conductivity on which is superimposed an epitaxial N type layer. Circuit components are fabricated in the N type layer by forming diffused regions of various configurations to form bipolar and/or unipolar transistors, and resistors and/or capacitors. The surface of the semiconductor body and of the circuit compenents is usually covered with an insulating protective layer except where connections are made to the diffused regions. Where the semiconductor is silicon, the protective layer is usually silicon dioxide. Instead of being fabricated within the semiconductor body, passive components such as resistors and capacitors may be fabricated either partially or completely on top of the insulating layer.

Often, in the layout of a microcircuit, topological considerations require that points which are intended to be operated at the same potential be separated physically from one another. Circuit components are usually connected by vapor deposited strips of metal having their configurations defined by conventional photolithographic techniques. However, since the metallic line connections between points have finite values of resistance, two connected points may not be at the same voltage. This may result in a potential unbalance which may degrade electrical performance.

One of the most frequently encountered contributors to the problem are ground connections. Grounded circuit points should be operated at the same potential, but with resistive paths between these points and ground it is virtually impossible to achieve this goal.

Another aspect of the general problem of connections is met with in circuits which are intended to be operated at high frequencies. At very high frequencies, i.e., the order of 20 megacycles and upwards, the AC impedance of the collector junction of a bipolar transistor becomes relatively very small, thereby increasing the tendency for high level signals to leave the collector regions of output transistors or to enter the collector regions of low level transistors. Where the substrate of the circuit is grounded to the header, most of this signal is shunted to ground.

But, where the substrate is of relatively high resistivity material, as it is in conventional circuits, some of the signal will travel laterally to other transistors.

One object of the present invention is to provide improved monolithic semiconductor microcircuits with improved connection between points that are intended to be operated at ground or other common potential and a common termination.

A further object of the invention is to provide monolithic semiconductor microcircuits having less tendency to oscillate at desirable operating voltages and at relatively high frequencies.

The type of circuit to which the present invention is applicable may include a semiconductor body which is normally composed of a relatively low conductivity substrate layer of a first type conductivity and another layer of a second type conductivity disposed on one side of the substrate layer. The layer of second type conductivity contains at least some of the circuit components. The present improvement in this type of circuit comprises adding a relatively high conductivity layer of first type conductivity disposed on the side of the substrate layer opposite the layer of second type conductivity and means extending through the substrate layer and the layer of second type conductivity electrically connecting points of common potential to the high conductivity layer. This last mentioned means may comprise highly conductive regions which have been formed in the semiconductor body by diffusion to isolate one circuit component from another. Connections to these regions from the usually closely adjacent equipotential points may be made in conventional manner by metal evaporation.

Figure 1:
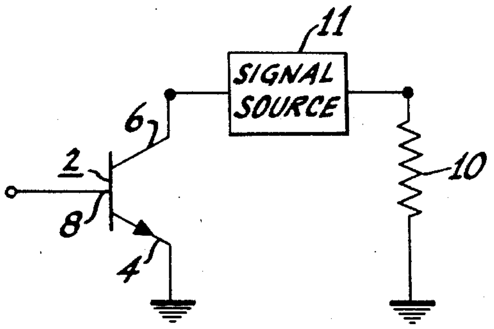

In the drawing:

FIGURE 1 is a schematic diagram of a portion of a circuit of the type in which the present invention may be utilized, and FIGURE 2 is a cross section view which includes the circuit portion of FIGURE 1 in monolithic integrated form.

Although the present invention is applicable to many different types of circuits, for purposes of illustration it will be described in connection with a common emitter type amplifier circuit, part of one of which is shown in FIGURE 1. Such a circuit may include a bipolar transistor 2 having a grounded emitter 4, a collector 6, and a base electrode 8. The circuit may also include a grounded resistor 10 which may be connected to the transistor 2 through other components such as a signal source 11.

Such a circuit as described above can be fabricated in integrated form. One integrated form is illustrated in FIGURE 2. The circuit of FIGURE 2 may be of the silicon monolithic type. It may include a metallic substrate 12 on which is mounted a wafer-shaped body 14 of single crystal silicon. The body 14 includes a lower layer 16 of relatively low resistivity P type material. This layer, designated P+, may be 8 mils thick, for example, and have a resistivity of up to about 0.1 ohm cm. The body also includes an intermediate layer 18 of relatively higher resistivity P type material which may be 0.65 mil thick, for example, and have a resistivity of 2 to 50 ohm cm. The body also has a top layer 20 of relatively low resistivity N type material which may be 0.42 mil thick, for example, and have a resistivity of about 0.1 to 5 ohm cm. The layers 16 and 20 may be provided by epitaxial growth techniques. In the prior art, this circuit was usually made omitting the lower layer 16 of low resistivity P+ type material.

Various circuit components are fabricated in or on the top layer 20 in this type of circuit. As illustrated, one of these components is a transistor 22 which includes a diffused P type base region 24, an N type emitter region 26 which is diffused within the base region 24, and a collector region 28. Beneath the collector region 28 of the transistor is an N+ pocket 30 which can be made by diffusing suitable impurities into the layer 18 before the top epitaxial layer 20 is grown. This pocket may be omitted but is desirable in order to reduce collector saturation resistance and to minimize spurious $\beta$ of a parasitic PNP transistor which is constituted of parts of the P type base region 24, the N type collector layer 20 and the P+ layer 16.

The integrated form of the circuit also includes a resistor 31 which is composed principally of a P type diffused region 32 having its length, width and impurity concentration adjusted to provide a desired value of resistance. An N+ pocket 34 may be included in the layer 18 beneath the resistor 31. This pocket also may be omitted but helps to minimize parasitic PNP transistor effects.

In order to electrically isolate one component from another, diffused regions of P+ type conductivity are provided surrounding each component. As illustrated, the isolation may be provided with a P+ diffused region 36 which, it will be understood, actually has a rectangular configuration entirely surrounding the transistor 22, and another diffused region 38 entirely surrounding the resistor 31. The surface of the layer 20 is covered with a protective layer 40 of, e.g., silicon dioxide, except where connections to the layer 20 are to be made. The emitter 26 of the transistor 22 has an electrode connection 42 extending through an opening in the protective layer 40. The emitter connection 42 is connected to isolation region 36 by means of a thin deposited metal strip 44 which lies on top of the protective layer 40 and a metal connection 45 to the isolation region 36 extending through an opening in the layer 40. The isolated region 36 extends down through the layers 20 and 18 to make electrical connection to the low conductivity layer 16 and constitutes part of a conducting path between the emitter 26 and the layer 16.

The transistor 22 also includes a base connection 46 shown not connected to anything else in the circuit, although it will be understood that, in a complete circuit, the base connection 46 would be connected to other circuit parts. The transistor also has a collector connection 47 and, again, it will be understood that in a complete circuit connection would be connected to other circuit parts.

The resistor 31 has one end of its diffused region 32 provided with a metallic connection 48 which, in turn is electrically connected to a metallized strip 50 extending over the top of the silicon dioxide layer 40 to connect to the diffused isolation region 38. Like the diffused region 36, the diffused region 38 provides an elecrtically conducting conducting path down through the layers 20 and 18 to the bottom layer 16 of the semiconductor wafer. The other end of the diffused region 32 of resistor 31 is provided with a metallic connection 52 which, although not shown connected to other circuit parts in the drawing, would be normally connected to another part of the circuit.

Although illustrated in the drawing as adjacent to each other, the transistor 22 and the resistor 31 could be separated relatively widely in an actual circuit. Thus, if the emitter region 26 of the transistor were to be connected in conventional manner across the top of the protective layer 40 to the diffused region 32 of the resistor, even though highly conductive metal strips were used, the connection would have significant resistance value. However, in the structure as shown, the conductive path between the emitter and the common ground termination 16 now comprises a relatively short external metal strip 44 and a short conducting path through the isolation region 36 to the layer 16. The bottom layer 16 serves as a common ground plane to which any desired number of ground connections may be made from different circuit components.

Another advantage of having a common ground termination as above described is that in a complex circuit there are usually many closely spaced connections required and it becomes virtually impossible to find a suitable surface route to economically connect all circuit points which are to be grounded.

What is claimed is:

1. In a microcircuit of the monolithic semiconductor type which comprises a plurality of interconnected circuit components including a plurality of separated circuit points that are intended to be operated at a common potential, said microcircuit comprising a semiconductor body which includes a relatively low conductivity substrate layer of a first type conductivity and another layer of second type conductivity on one side of said substrate layer, said another layer containing at least some of said components including said circuit points, the improvement comprising a relatively high conductivity layer of said first type conductivity disposed on the side of said substrate layer opposite said another layer, and electrically conductive means extending thorugh said substrate layer and said another layer connecting said common potential points to said high conductivity layer.

2. A circuit according to claim 1 in which said electrically conductive means comprises a region of said body which is of high conductivity and of said first type conductivity.

3. A circuit according to claim 2 in which said body region of high conductivity is disposed between two of said circuit components and thereby also serves as isolation means between said two circuit components.

4. A microcircuit of the monolithic semiconductor type comprising a semiconductor body composed of a series of epitaxial layers including a first relatively low conductivity layer of a first type conductivity centrally disposed in said body, a second layer of second type conductivity integral with one face of said first layer, and a third layer of relatively high conductivity and of said first type conductivity integral with the opposite face of said first layer, a plurality of interconnected circuit components disposed in or on said second layer, said components having points intended to be operated at a mutually common potential, high conductivity isolation regions of said first type conductivity extending from said surface through said second and first layers to said third layer, and means electrically connecting said points to certain ones of said isolation regions.

References Cited

UNITED STATES PATENTS 3,260,902 7/1966 Porter ------------- 317—235

JOHN W. HUCKERT, *Primary Examiner.*

J. R. SHEWMAKER, *Assistant Examiner.*

U.S. Cl. X.R.

317—235